United States Patent [19]
Davis et al.

[11] Patent Number: 5,283,016
[45] Date of Patent: Feb. 1, 1994

[54] METHOD FOR PREPARING PHOTOSENSITIVE MICROCAPSULES

[75] Inventors: Paul Davis, Centerville; Jacqueline G. Truini, Dayton, both of Ohio

[73] Assignee: The Mead Corporation, Dayton, Ohio

[21] Appl. No.: 321,251

[22] Filed: Mar. 9, 1989

[51] Int. Cl.$^5$ ............... B01J 13/18; B01J 13/20; G03C 1/72
[52] U.S. Cl. .................. 264/4.33; 264/4.3; 264/4.7; 430/138
[58] Field of Search .............. 264/4.3, 4.33, 4.7; 430/138

[56] References Cited

U.S. PATENT DOCUMENTS

| | | | |
|---|---|---|---|
| 3,443,948 | 5/1969 | Bryan | 430/138 |
| 3,516,941 | 6/1970 | Matson | 428/402.21 |
| 3,657,379 | 4/1972 | Hilbelink et al. | 428/402.22 X |
| 3,839,047 | 10/1974 | Suga et al. | 430/138 |
| 4,105,823 | 8/1978 | Hasler et al. | 428/402.21 X |
| 4,578,339 | 3/1986 | Adkins | 430/138 |
| 4,588,639 | 5/1986 | Ozono | 428/402.22 |
| 4,842,978 | 6/1989 | Ishikawa | 430/138 |
| 4,874,685 | 10/1989 | Adair | 430/138 |

Primary Examiner—Richard D. Lovering
Attorney, Agent, or Firm—Thompson, Hine & Flory

[57] ABSTRACT

The present invention is directed to an improved method for forming photosensitive microcapsules and increasing sensitivity by incorporating a thiol into the microcapsules through diffusion while maintaining an aqueous surrounding medium at a pH of 7.0 or less.

9 Claims, No Drawings

METHOD FOR PREPARING PHOTOSENSITIVE MICROCAPSULES

BACKGROUND OF THE INVENTION

The present invention relates to an improved method for preparing photosensitive microcapsules.

U.S. Pat. Nos. 4,399,209 and 4,440,846 disclose imaging systems and processes which employ photosensitive microcapsules. These microcapsules typically contain a photohardenable or photosoftenable composition and a color precursor. The release of the color precursor from the microcapsules is controlled by exposure of the microcapsules to actinic radiation.

Particularly in photohardenable microcapsules which harden by free radical polymerization, it has been found desirable to include a thiol in the photohardenable composition to improve sensitivity. The thiol reacts with oxygen, which inhibits free radical polymerization, in an autoxidative process and may also react via a chain transfer mechanism.

While it has been shown that the thiol improves the sensitivity of photohardenable compositions, the results which have been obtained when such thiol-containing photohardenable compositions are microencapsulated have been somewhat mixed and difficult to reproduce. The improvements in sensitivity which have been observed for microcapsules have not been as large as those observed for unencapsulated compositions. This observation has lead to the discovery that the microencapsulation process is interfering with the incorporation of the thiol into the photohardenable composition.

In microencapsulating photohardenable compositions, an oil-in-water emulsion is prepared by emulsifying the constituents of the photohardenable composition in an aqueous medium and building the microcapsule wall around the emulsified droplets of the internal phase. In forming the wall, it is not unusual to effect one or more pH changes in the aqueous phase. In particular, in the preparation of urea-formaldehyde and melamine formaldehyde microcapsules, after the wall is formed, the pH is adjusted to about 9.5 to scavenge excess formaldehyde. It is believed that at the alkaline pH, the thiol is deprotonated and extracted from the photohardenable composition into the aqueous phase. As a result, the concentration of the thiol in the photohardenable composition is reduced and the thiol is not as effective in improving sensitivity.

Accordingly, there is a need for improved methods for forming photosensitive microcapsules containing thiols.

SUMMARY OF THE INVENTION

In accordance with the present invention, an improved method for forming photosensitive microcapsules containing a thiol is provided wherein the thiol is added to the internal phase of the microcapsules after wall formation. The method of the present invention is advantageous because microcapsules may be formed in an otherwise known manner at optimum pH and after the microcapsules are formed, they are retained in an aqueous medium containing a thiol at a pH of 7.0 or less whereupon the thiol diffuses from the aqueous medium, through the wall, and into the photosensitive composition. In accordance with the present invention the thiol may initially be added to the photosensitive composition prior to wall formation, allowed to diffuse from the composition during wall formation, and forced back through the wall at neutral or acid pH after wall formation; but the preferred method appears to be simply to add the thiol to an aqueous phase containing the microcapsules after wall formation at neutral or acid pH and allow it to diffuse into the microcapsules.

Accordingly one manifestation of the present invention is a method for forming photosensitive microcapsules which comprises the steps of:

emulsifying droplets of photosensitive composition in a continuous aqueous phase to form an oil-in-water emulsion;

forming a wall around said droplets of said photosensitive composition;

adjusting the pH of said emulsion to 7.0 or less; and adding a thiol to said aqueous phase; whereupon said thiol diffuses from said aqueous phase into said photosensitive composition.

More particularly, the present invention provides an improved method for forming amine-formaldehyde microcapsules containing a photosensitive composition wherein the microcapsules wall is formed from a urea-formaldehyde or a melamine-formaldehyde resin.

Still more particularly, the present invention provides an improved method for forming photosensitive microcapsules containing a free radical polymerizable photosensitive composition and, still more particularly, a composition containing a cyanine dye-borate complex as a photoinitiator.

DETAILED DESCRIPTION OF THE INVENTION

Those skilled in the art will appreciate that the method of the present invention may be useful in the preparation of photosensitive microcapsules in general where it is desired to incorporate a thiol into the photosensitive composition. The invention will be specifically illustrated with respect to the preparation of amine-formaldehyde microcapsules by in situ polymerization, however, it may also be useful in the preparation of other types of microcapsules such as the preparation of polyurea and polyurethane microcapsules by interfacial polymerization, the preparation of gelatin or gum arabic microcapsules by coacervation, and others. The invention will also be specifically illustrated with respect to free radical addition polymerizable compositions since it has been established that thiols improve the sensitivity of those compositions through their interaction with oxygen, however, to the extent that it may be advantageous to add thiols to other types of microencapsulated photosensitive compositions, the thiols may be added by the method of the present invention.

The method is particularly directed to the introduction of thiols into oily core containing microcapsules prepared under conditions which tend to foster extraction of the thiol from the core. Typically, the preparation of these microcapsules involves alkaline conditions which deprotonate the thiol making it much more water soluble. Such conditions are encountered in the preparation of amine-formaldehyde microcapsules. While the techniques of the present invention can be used to prepare other types of microcapsules, in those cases where capsule building conditions do not foster extraction of the thiol from the core, the method of the present invention is probably unnecessary.

The photosensitive compositions which are microencapsulated in accordance with the present invention are not new per se. Examples of useful compositions are disclosed in U.S. Pat. Nos. 4,399,209; 4,440,846; 4,772,530; 4,772,541 pending U.S. application Ser. No. 755,400. The preferred photosensitive compositions are free radical polymerizable compositions containing an ethylenically unsaturated compound such as trimethylol-propane triacylate and an ionic dye complex such as a cyanine dye borate as a photoinitiator.

Representative examples of useful thiols include mercaptobenzothiazoles such as 6-ethoxy-2-mercaptobenzothiazole, 2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis(mercaptoacetate), pentaerythritol tetrakis(3-mercaptoproprionate), trimethylolpropane tris(mercaptoacetate), trimethylolpropane tris(3-mercaptopropionate), 4-acetamidothiophenol, mercaptosuccinic acid, dodecanethiol, 2-mercaptopyridine, 4-mercaptopyridine, 2-mercapto-3H-quinazoline, and 2-mercaptothiazoline, alkylthiophenol, alkoxythiophenol, chlorothiophenol, bromothiophenol, acylthiophenol, dialkylaminothiophenol, trifluoromethylthiopehnol, and hydroxythiophenol wherein the number of carbons in the groups ranges from 1 to 20.

The amount of thiol added to the aqueous phase will depend on a number of factors including its solubility in water, also the solubility of the thiol in the photosensitive composition, the amount of thiol desired to be added to the photosensitive composition, and the mount of the photosensitive composition present. Based on the amount of monomer present in the photosensitive composition, the amount of thiol is generally about 0.1 to 5 parts per 100 parts monomer. Based on the amount of water, it is about 0.2 to 16 g/l. Preferably the suspension is maintained at a temperature in the range of 20° C. to 80° C. and preferably 45° C. to 75° C. while diffusion is taking place, at a neutral pH (7.0); but pH as low as 4 may be used. The microcapsules will typically be maintained in the thiol aqueous phase until the thiol concentration stabilizes, generally 0.5 to 2 hours depending on the temperature and the nature of the third.

In accordance with the invention, the thiol is preferably introduced to the photosensitive composition from the slurry at a neutral or acid pH., e.g., 4 to 7. The deprotonated thiol is very water soluble by adjusting pH to neutral or acid, the thiol is protonated and more soluble in the photosensitive composition. If desirable, the thiol may be added to the slurry at an alkaline pH and the pH may be adjusted to acid or neutral pH.

Photosensitive microcapsules preferably have an average particle size in the range of about 4 to 8 microns and preferably at least 90% of the microcapsules have a particle size less than 10 microns. Microcapsules having an average particle size of 5 microns and a size distribution of 2 to 10 microns are preferred.

The present invention is particularly directed to forming microcapsules in which the oily core material is enwrapped in an amine-formaldehyde condensation product. Such microcapsules are formed by in situ condensation of formaldehyde and an amine such as urea, melamine, dimethylol urea, and the like, or a pre-condensate thereof. The condensation product can be modified by the co-condensation of a polyhydric phenol such as resorcinol if desired.

Amine-formaldehyde microcapsules can be prepared by forming an aqueous phase containing an emulsifier and/or a systems modifier, adjusting the pH to suit the condensation reaction to be employed, followed by the addition of the oil phase. Generally, a pH of about 4.0 is useful in making urea-formaldehyde microcapsules whereas a pH of 6.0 is used in making melamine-formaldehyde capsules. Among other well known encapsulation techniques that can be used are those described by Kiritani et al. in U.S. Pat. No. 3,796,669 for urea-resorcinol-formaldehyde capsules and Forris et al. in U.S. Pat. Nos. 4,001,140; 4,087,376 and 4,089,802 for melamine-formaldehyde capsules.

It has been found particularly desirable to use a combination of pectin and polystyrene sulfonate as the emulsifier/system modifier. Pectin is generally added to the aqueous phase in an amount of about 1.0 to 8% based on the amount of water in the aqueous phase, with the preferred amount being about 2 to 4%.

Typical examples of sulfonated polystyrenes useful in the present invention are Versa TL500 and Versa TL502B, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystyrenes are better than others.

Emulsification is preferably conducted under conditions which afford an emulsion having an average particle size in the range of about 2.5 to 5.0 microns. The observed particle size of the emulsion is somewhat smaller than the particle size of the capsules produced.

One method in accordance with the present invention involves the following steps:
(i) Preparing an aqueous solution of pectin and sulfonated polystyrene and adjusting pH to about 6.0
(ii) Emulsifying the photosensitive composition and color former in the aqueous solution
(iii) Adding amine and formaldehyde or amineformaldehyde precondensate to the system
(iv) Adjusting to acid pH (about 6.0)
(v) Polymerizing the amine and formaldehyde while stirring the system
(vi) Heating
(vii) Adjusting to alkaline pH (about 9.5) and reacting the excess formaldehyde
(viii) Stirring and allowing pH to drop 7.8-8.2
(ix) Adjusting to neutral or acid pH
(x) Adding a thiol to the aqueous phase and allowing the thiol to diffuse into the microcapsules at 65°-70° C. over a period of 0.5 to 2 hours.

The condensation reaction proceeds under acid conditions, e.g., pH of 7 or less; however, the reaction is preferably carried out at a pH in the range of 2.5 to 6.0. The temperature of the encapsulation medium should be maintained at about 10° to 95° C., preferably about 25° to 85° C. and more preferably about 45° to 75° C.

Among the acid catalysts that may be used are low molecular weight carboxylic acids, e.g., formic acid, acetic acid, etc.; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The amine and formaldehyde are preferably present in the encapsulation medium, whether as the free monomer or a precondensate, in a molar ratio of formaldehyde to amine of at least 1.5 and preferably about 2.0 to 3.0.

To reduce malodor and the incidence of skin irritation, when the polymerization reaction is complete, it is desirable to remove or react the excess formaldehyde. This can be accomplished by using any one of several known techniques such as the addition of phosphoric acid, urea, sulfite or bisulfite. These materials react with the formaldehyde to form a product which is easily removed from the medium. The addition of the urea or sodium sulfite to scavenge formaldehyde is preferably made in a single step after encapsulation and prior to storage. The pH and temperature of the medium should be adjusted for this reaction. The sulfite is preferably reacted at pH of 6 to 8 at room temperature for about 2 hours. The urea can be reacted at a pH of 3 to 5 or 8 to 12 at a temperature of 30° to 60° C. for 4 hours.

Suitable polyhydric phenols that may be added to the reaction system for co-condensation with the amine and formaldehyde to improve impermeability are resorcinol, catechol, gallic acid, and the like. The phenols may be added in an amount of about 5 to 30% by weight based on the amount of urea.

In most cases it is desirable to add a polyisocyanate to the core material. This practice is described in detail in U.S. Pat. No. 4,353,809. The polyisocyanate is believed to react with water at the interface of the core material and the aqueous medium and form a thin layer of polymer which further stabilizes the emulsion. Preferred polyisocyanates are SF-50, an aromatic trisocyanate manufactured by Union Carbide, and Desmodur and N-100, a biuret of hexamethylene diisocyanate and water available from Mobay Chemical Co. The isocyanate is typically added in an amcunt of about 0.005 to 3 parts per 100 parts of the core material and preferably 0.01 to 2 parts.

430 g. water was added to a 1200 ml. stainless steel beaker equipped with an overhead mixer having a 6 bladed propeller (45 degree pitch). The mixer was operated at 500 r.p.m. and 8.0 g. Versa TL502B (a product of National Starch Company) was slowly sifted into the the stirred water. Stirring was continued for 15 minutes and thereafter 12.65 g. pectin and 0.24 g. sodium bicarbonate was added after increasing the stirring rate to 1500 r.p.m. Stirring was continued for approximately 2 hours and the pH of the aqueous phase was adjusted to 6.0 with 10% sodium hydroxide.

An internal phase composition was prepared by heating 150 grams TMPTA to 90° C. while stirring in a 400 ml. glass beaker. 36 g. of a magenta dye color precursor commercially available from Hilton Davis Chemical Company under the designation HD 5100 was added to the stirred monomer. Stirring was continued at 90° C. for 30 minutes and then cooled to 70° C. The photoinitiator (1,1′-di-n-heptyl-3,3,3′,3′-tetramethylindocarbocyanine triphenyl-n-butylborate) was added at 70° C. The composition was stirred at 70° C. for 30 minutes and 1.5 g. DIDMA was added with 10 g. Desdomur N-100 (a product of Bayer). Stirring was continued for 5 minutes.

After completing preparation of the internal phase composition, the aqueous phase composition is stirred at 3,000 r.p.m. for 10 minutes at 28° to 35° C. The internal phase composition is heated to 65°–75° C. and slowly added to the aqueous phase over a period of 30 seconds. Emulsification is continued at 3,000 r.p.m. for 15 minutes.

A wall former solution is prepared by weighing 198.9 g. deionized water into a glass beaker. 17.7 g. melamine is added to the beaker with stirring. The contents of the beaker are stirred for 5 minutes whereafter 29.4 g. of a 37% formaldehyde solution is added into the mixture. The pH of the mixture is adjusted to 9.5 with 10% aqueous solution of sodium carbonate. The mixture is covered and heated to 60° C. over a period of 30 minutes. Thereafter, the melamine and formaldehyde are allowed to cure for 60 minutes at 60° C. to prepare a pre-condensate.

Upon completion of the emulsification of the internal phase into the aqueous phase, the stirring rate is reduced to 1500 r.p.m. and the wall former is added slowly. The pH is adjusted to 6.0 with 10% phosphoric acid. The emulsion is covered and placed in a 70° C. water bath. The walls are allowed to cure for 60 minutes whereafter 46.2 g. of a 50% w/w solution urea is added thereto. The walls are allowed to cure an additional 40 minutes. The stirring rate is then reduced to 500 r.p.m. 15 g. 10% sodium hydroxide is added. The microcapsules are allowed to cool to room temperature with stirring at 500 r.p.m. overnight.

After stirring the capsules overnight, the pH of the capsule slurry is adjusted to 7.0 with phosphoric acid. EMBT is added to the capsule slurry and stirring is continued at 500 r.p.m. in a 70° C. water bath for 2 hours. The capsules are removed and allowed to cool to room temperature.

Having described the invention in detail and by reference to preferred embodiments thereof, it will be apparent that modifications and variations are possible without departing from the scope of the invention defined by the following claims.

What is claimed is:

1. A method for preparing photosensitive microcapsules which comprises the steps of:
   emulsifying a photosensitive composition in a continuous aqueous phase;
   forming a wall around the droplets of said photosensitive composition in said aqueous phase and thus producing a capsule slurry;
   adjusting the pH of said capsule slurry to 7.0 or less;
   adding a thiol to said capsule slurry before or after adjusting said pH, and
   retaining said microcapsules in said thiol containing slurry for a period of time sufficient to enable said thiol to diffuse from said slurry into said photosensitive composition.

2. The method of claim 1 wherein said step of forming said wall includes the steps of adding melamine and formaldehyde or a prepolymer thereof to said aqueous phase.

3. The method of claim 2 wherein said continuous aqueous phase contains pectin and sulfonated polystyrene.

4. The method of claim 1 wherein said photosensitive composition is a free radical addition polymerizable composition.

5. The method of claim 4 wherein said free radical addition polymerizable composition contains an ethylenically unsaturated compound.

6. The method of claim 1 wherein said thiol is added to said aqueous phase in an amount of 0.1 to 5 parts per 100 parts monomer.

7. The method of claim 1 wherein said step of forming said wall includes the steps of adding urea and formaldehyde or a prepolymer thereof to said continuous aqueous phase.

8. The method of claim 1 wherein said thiol is selected from the group consisting of 6-ethoxy-2-mercaptobenzothiazole, 2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis(mercaptoacetate), pentaerythritol tetrakis(3-mercaptoproprionate), trimethylolpropane tris(mercaptoacetate), trimethylolpropane tris(3-mercaptopropionate), 4-acetamidothiophenol, mercaptosuccinic acid, dodecanethiol, 2-mercaptopyridine, 4-mercaptopyridine, 2-mercapto-3H-quinazoline, and 2-mercaptothiazoline, alkylthiophenol, alkoxythiophenol, chlorothiophenol, bromothiophenol, acylthiophenol, dialkylaminothiophenol, trifluoromethylthiophenol, and hydroxythiophenol wherein the number of carbons in the substituent groups ranges from 1 to 20.

9. The method of claim 8 wherein said thiol is selected from the group consisting of 6-ethoxy-2-mercaptobenzothiazole, 2-mercaptobenzothiazole, and phenylmercaptobenzothiazole.

* * * * *